(12) United States Patent
Park et al.

(10) Patent No.: US 9,368,752 B2
(45) Date of Patent: Jun. 14, 2016

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: WonKi Park, Paju-si (KR); HyeJeong Park, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/519,818

(22) Filed: Oct. 21, 2014

(65) Prior Publication Data

US 2015/0129852 A1    May 14, 2015

(30) Foreign Application Priority Data

Nov. 11, 2013    (KR) .................. 10-2013-0136465

(51) Int. Cl.
   *H01L 51/52*   (2006.01)
   *H01L 51/56*   (2006.01)
   *H01L 27/32*   (2006.01)

(52) U.S. Cl.
   CPC .......... *H01L 51/5262* (2013.01); *H01L 27/322* (2013.01); *H01L 27/3262* (2013.01); *H01L 51/5281* (2013.01); *H01L 51/56* (2013.01); *H01L 27/3213* (2013.01); *H01L 27/3244* (2013.01)

(58) Field of Classification Search
   CPC ........................ H01L 51/5281; H01L 51/5284
   See application file for complete search history.

(56) References Cited

U.S. PATENT DOCUMENTS

| 2008/0042553 | A1  | 2/2008  | Li |
| 2010/0194268 | A1* | 8/2010  | Choi ................ H01L 27/3213 313/504 |
| 2012/0280259 | A1* | 11/2012 | Hatta ............... H01L 27/3213 257/89 |
| 2013/0249383 | A1  | 9/2013  | Yoo et al. |

FOREIGN PATENT DOCUMENTS

| EP | 0952478 A1    | 10/1999 |
| KR | 20090054756 A | 6/2009  |
| KR | 101025863 B1  | 3/2011  |

* cited by examiner

*Primary Examiner* — Daniel Shook
(74) *Attorney, Agent, or Firm* — Dentons US LLP

(57) ABSTRACT

Disclosed is an organic light emitting display (OLED) device that may include first and second pixels on a substrate, each including a TFT region and a display region, the display region of each of the first and second pixels including a first electrode, an emission layer and a second electrode; a color filter layer in the display region of the second pixel; and a reflection preventing layer in the first and second pixels, substantially excluding the display region of the second pixel.

19 Claims, 10 Drawing Sheets

ORGANIC LIGHT EMITTING DISPLAY DEVICE AND METHOD OF MANUFACTURING THE SAME

CROSS REFERENCE TO RELATED APPLICATIONS

This application claims the benefit of the Korean Patent Application No. 10-2013-0136465 filed on Nov. 11, 2013, which is hereby incorporated by reference for all purposes as if fully set forth herein.

BACKGROUND OF THE INVENTION

1. Field of the Invention

The present invention relate to an organic light emitting display (OLED) device and method of manufacturing the same, and more particularly, to an OLED device provided with a reflection preventing layer and method of manufacturing the same.

2. Discussion of the Related Art

An organic light emitting display (OLED) device includes a light emitting layer provided between a cathode for injecting electrons and an anode for injecting holes. When the electrons generated in the cathode and the holes generated in the anode are injected into the inside of the light emitting layer, excitons are produced by the recombination of the electrons and the holes. Then, when the excitons fall to a lower energy state from an excited state, the OLED device emits light.

Hereinafter, an OLED device according to the related art will be described with reference to the accompanying drawings.

FIG. 1 is a cross-sectional view illustrating the OLED device according to the related art.

As shown in FIG. 1, the OLED device according to the related art may include a substrate 10, a thin film transistor 20, a passivation film 30, a color filter layer 40, a planarization layer 50, a first electrode 60, a bank layer 65, a light emitting layer 70, a second electrode 80, and a reflection preventing layer 90.

The thin film transistor 20 is provided on an upper surface of the substrate 10. The thin film transistor 20 may include a gate electrode 21 patterned on the substrate 10, a semiconductor layer 22 insulated from the gate electrode 21 by a gate insulating film 15 interposed therebetween, and source and drain electrodes 23 and 24 provided at a fixed interval from each other and provided on the semiconductor layer 22.

The passivation film 30 is provided on the thin film transistor 20.

The color filter layer 40 is patterned on the passivation film 30.

The planarization layer 50 is provided on the color filter layer 40. A contact hole is formed in a predetermined region of the passivation film 30 and the planarization layer 50, whereby a drain electrode 24 of the thin film transistor 20 is exposed via the contact hole.

The first electrode 60 is patterned on the planarization layer 50. The first electrode 60 is connected with the drain electrode 24 via the contact hole.

The bank layer 65 is provided on the planarization layer 50. The bank layer 65 is provided on a thin film transistor (TFT) region, to thereby define a display region.

The light emitting layer 70 is provided on the first electrode 60, and is patterned on the display region defined by the bank layer 65. The light emitted from the light emitting layer 70 passes through the color filter layer 40 and then the substrate 10, to thereby display an image.

The second electrode 80 is provided on the light emitting layer 70.

The reflection preventing layer 90 is provided on a lower surface of the substrate 10, to thereby prevent external light from being reflected on the lower surface of the substrate 10. As described above, the thin film transistor 20 is formed in the TFT region. Thus, the external light is reflected due to a plurality of signal lines for forming the thin film transistor 20. In this respect, the reflection preventing layer 90 is provided on the lower surface of the substrate 10 so as to reduce or prevent the reflection of the external light.

However, in the OLED device according the related art, the reflection preventing layer 90, which is typically provided in a film type, is formed in both the TFT region and the display region, which lowers the light transmittance of the display region and the luminance of the OLED device. That is, when the light emitted from the light emitting layer 70 of the display region passes through the substrate 10 and then the reflection preventing layer 90, a considerable amount of light is absorbed in the reflection preventing layer 90, thereby causing a light loss.

SUMMARY OF THE INVENTION

Accordingly, the present invention is directed to an organic light emitting display (OLED) device and method of manufacturing the same that substantially obviates one or more problems due to limitations and disadvantages of the related art.

An advantage of the present invention is to provide an OLED device that is adapted to improve luminance by reducing or preventing a reflection of an external light.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described herein, an organic light emitting display (OLED) device may, for example, include first and second pixels on a substrate, each including a TFT region and a display region, the display region of each of the first and second pixels including a first electrode, an emission layer and a second electrode; a color filter layer in the display region of the second pixel; and a reflection preventing layer in the first and second pixels, substantially excluding the display region of the second pixel.

In another aspect of embodiments of the present invention, a method of manufacturing an organic light emitting display (OLED) device including first and second pixels on a substrate, each including a TFT region and a display region, the display region of each of the first and second pixels including a first electrode, an emission layer and a second electrode, the method comprising: forming a color filter layer in the display region of the second pixel; and forming a reflection preventing layer in the first and second pixels, substantially excluding the display region of the second pixel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers may be used throughout the drawings to refer to the same or like parts.

In the following description, when a first element is positioned "on" or "above" a second structure, the first and second elements may be in contact with each other, or a third element(s) may be interposed between the first and second elements. Also, when terms such as "the first" or "the second" are used to refer to elements, they may be used to separate any one element from other elements, but not necessarily define the order of corresponding elements.

Hereinafter, an organic light emitting display (OLED) device according to embodiments of the present invention and method of manufacturing the same will be described in detail with reference to the accompanying drawings.

Figure 1:
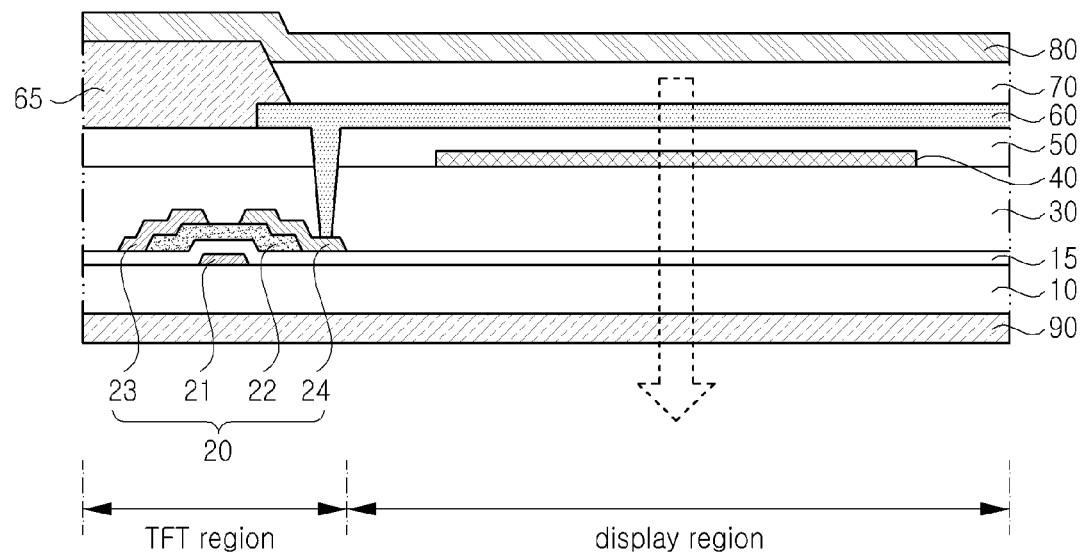
FIG. 1 is a cross-sectional view illustrating an organic light emitting display (OLED) device according to the related art.
Figure 2A:
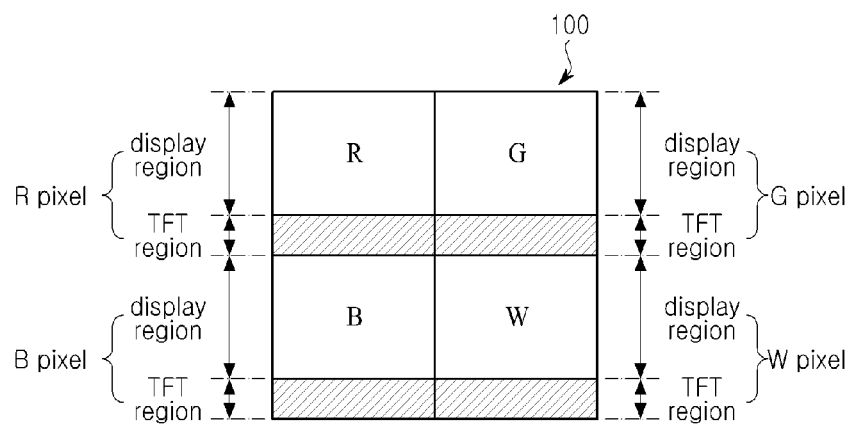
FIG. 2A and FIG. 2B are plan and cross-sectional views illustrating an OLED device according to an embodiment of the present invention, respectively.
Figure 2B:
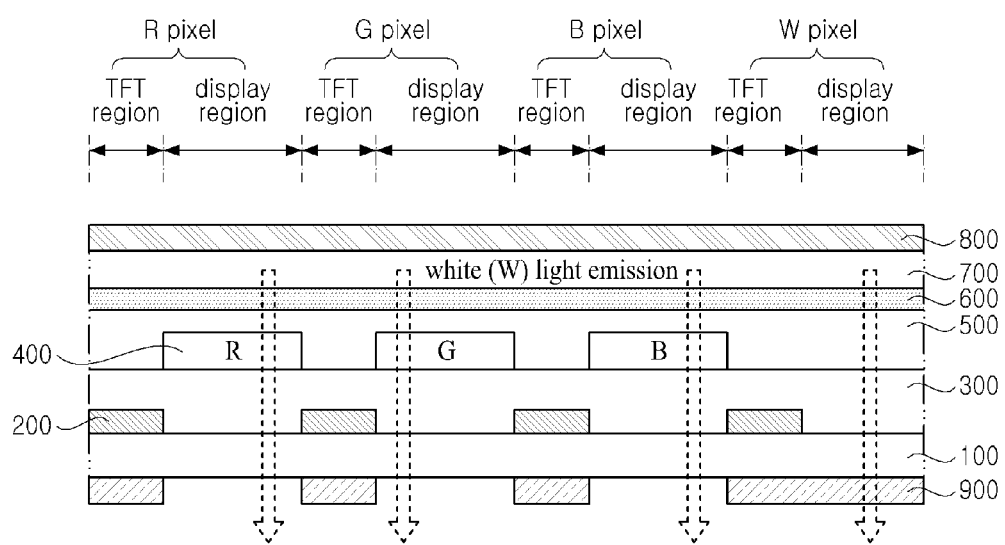

FIG. 2A and FIG. 2B are plan and cross-sectional views illustrating an OLED device according to an embodiment of the present invention, respectively.

As illustrated in FIG. 2A, the OLED device may include red (R), green (G), blue (B) and white (W) pixels on a substrate 100. The arrangement of the red (R), green (G), blue (B) and white (W) pixels may vary, and it is not, for example, limited to the above four pixels.

Each of the red (R), green (G), blue (B) and white (W) pixels may include a thin film transistor (TFT) region and a display region. A plurality of thin film transistors (TFT) and capacitors are formed in the TFT region, and a light emitting layer is formed in the display region. Thus, an image is displayed in the display region.

As illustrated in FIG. 2B, an OLED device may include a substrate 100, a thin film transistor 200, a passivation film 300, a color filter layer 400, a planarization layer 500, a first electrode 600, a light emitting layer 700, a second electrode 800, and a reflection preventing layer 900.

The thin film transistor 200 is provided on an upper surface of the substrate 100. In detail, the thin film transistor 200 is patterned in the TFT region for each of the red (R), green (G), blue (B) and white (W) pixels.

The passivation film 300 is provided on an entire area of the substrate 100 including the thin film transistor 200.

The color filter layer 400 is patterned in the display region for each of the red (R), green (G), and blue (B) pixels. That is, the red (R) color filter layer 400 is formed in the display region of the red (R) pixel, the green (G) color filter layer 400 is formed in the display region of the green (G) pixel, and the blue (B) color filter layer 400 is formed in the display region of the blue (B) pixel.

The color filter layer 400 may not be formed in the display region of the white (W) pixel. In case of the white (W) pixel, a white-colored light, which is emitted from the light emitting layer 700, is emitted intactly through the white (W) pixel. Thus, there may be no need for an additional color filter layer in the white (W) pixel. Meanwhile, in case of the red (R), green (G) and blue (B) pixels, when a white-colored light, which is emitted from the light emitting layer 700, passes through each color filter layer 400, the white-colored light is changed to light with a color of the corresponding pixel.

The planarization layer 500 is provided on an entire area of the substrate 100 including the color filter layer 400.

The first electrode 600 is patterned on the planarization layer 500. The first electrode 600 is formed of a transparent conductive material such as Indium-Tin-Oxide (ITO).

The light emitting layer 700 is patterned on the first electrode 600. The light emitting layer 700 emits a white-colored light. Thus, the light emitting layer 700 may be formed by a combination of red, green and blue light emitting layers, or may be formed by a combination of orange and blue light emitting layers. The light emitting layer 700 may be formed in various types generally known to those skilled in the art.

The second electrode 800 is provided on the light emitting layer 700.

The reflection preventing layer 900 is provided on a lower surface of the substrate 100. The reflection preventing layer 900 is provided on the lower surface of the substrate 100 in a predetermined pattern.

In detail, the reflection preventing layer 900 is formed in the TFT region for each of the red (R), green (G), blue (B) and white (W) pixels. As the thin film transistor 200 is formed in the TFT region for each pixel on the upper surface of the substrate 100, an external light is reflected due to a plurality of signal lines for forming the thin film transistor 200. In order to reduce or prevent the external light from being reflected from the TFT region, the reflection preventing layer 900 is formed in the TFT region for each pixel. The reflection preventing layer 900 may be formed to cover an entire TFT region for each pixel.

Meanwhile, the reflection of an external light also occurs by the first electrode 600 in the display region for each of the red (R), green (G), blue (B) and white (W) pixels. In case of the red (R), green (G) and blue (B) pixels, the color filter layer 400 is formed between the first electrode 600 and the substrate 100, whereby a considerable amount of the external light is absorbed in the color filter layer 400. Thus, a problem caused by the reflection of external light scarcely occurs in the display region for each of the red (R), green (G) and blue (B) pixels, whereby the reflection preventing layer 900 may not be needed in the display region for each of the red (R), green (G) and blue (B) pixels.

However, since the color filter layer 400 is not formed in the white (W) pixel, a problem caused by the reflection of external light may occur therein. For this reason, the reflection preventing layer 900 is beneficially formed in the display region of the white (W) pixel.

Thus, the reflection preventing layer 900 is not formed in the display region for the pixels that have the color filter layer 400 between the first electrode 600 and the substrate 100 (e.g., red (R), green (G) and blue (B) pixels), and the reflection preventing layer 900 is formed in the display region for the pixel in which the color filter layer 400 is not formed between the first electrode 600 and the substrate 100 (e.g., white (W) pixel), whereby luminance is improved by reducing or minimizing the reflection of the external light and decreasing a loss of emitted light. That is, the reflection preventing layer 900 is not formed in the display region for each of the red (R), green (G) and blue (B) pixels so that it is possible to decrease the loss of light emitted therein, thereby improving the luminance.

In other words, the reflection preventing layer 900 is formed in the TFT region for each of the red (R), green (G), blue (B) and white (W) pixels, and the reflection preventing layer 900 is not formed in the display region for each of the red (R), green (G) and blue (B) pixels, whereby it is possible to reduce or prevent the reflection of an external light and to reduce or minimize the loss of light, thereby improving the luminance.

The reflection preventing layer 900 is not formed in an entire area of the lower surface of the substrate 100, but is patterned in the predetermined portion. That is, it is difficult to apply a film-type reflection preventing layer as in the related art. Accordingly, the reflection preventing layer 900 according to an embodiment of the present invention is obtained by coating and patterning a coatable material layer, which will now be described in detail.

Figure 3:
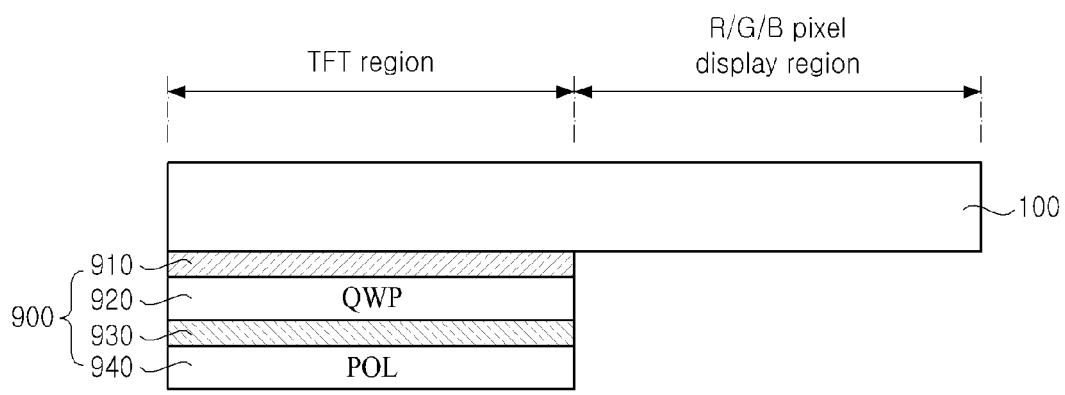
FIG. 3 is a cross-sectional view illustrating a reflection preventing layer according to an embodiment of the present invention.
Figure 4:
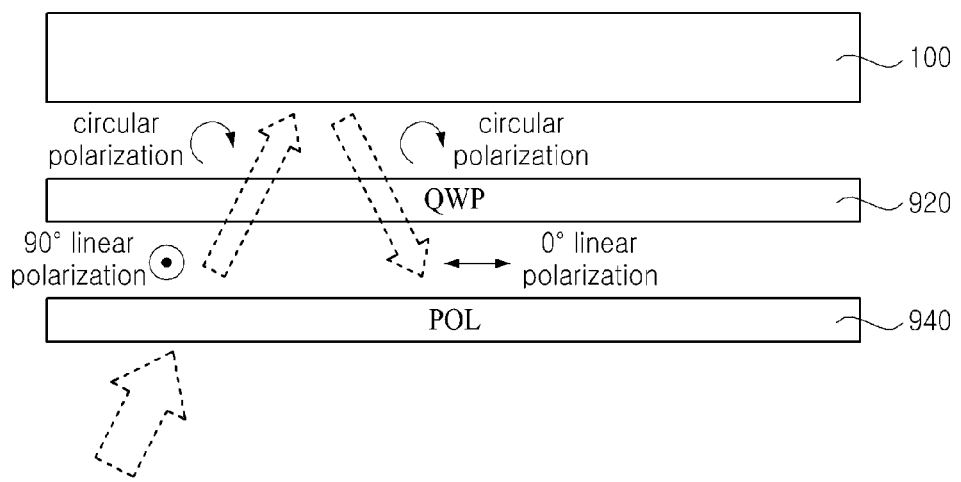
FIG. 4 is a concept view illustrating a function of a reflection preventing layer according to an embodiment of the present invention.

FIG. 3 is a cross-sectional view illustrating a reflection preventing layer according to one embodiment of the present invention. FIG. 4 is a concept view illustrating a function of a reflection preventing layer according to an embodiment of the present invention.

As illustrated in FIG. 3, the reflection preventing layer 900 according to an embodiment of the present invention may include a first alignment layer 910, a quarter wave plate (QWP) 920, a second alignment layer 930, and a linear polarization layer (POL) 940.

The first alignment layer 910 is provided on a lower surface of the substrate 100, and the quarter wave plate 920 is provided on a lower surface of the first alignment layer 910.

Since the first alignment layer 910 is aligned in a first direction, the first alignment layer 910 aligns a material for the quarter wave plate 920, whereby the quarter wave plate 920 has a predetermined polarizing function. A manufacturing process thereof will now be described.

The first alignment layer 910 may be formed of a photo-alignment material such as acrylate-based material or epoxy-based material, but not limited to these materials.

The quarter wave plate 920 may be formed of reactive mesogen, and the quarter wave plate 920 may have a 45° or −45° transmission axis. The quarter wave plate 920 may serve to covert a 90° linear polarization into a circular polarization and a circular polarization into a 0° linear polarization.

The second alignment layer 930 is provided on a lower surface of the quarter wave plate 920, and the linear polarization layer 940 is provided on a lower surface of the second alignment layer 930.

Since the second alignment layer 930 is aligned in a second direction which is different from the first direction, the second alignment layer 930 aligns a material for the linear polarization layer 940, whereby the linear polarization layer 940 has a predetermined polarizing function. A manufacturing process thereof will now be described.

The second alignment layer 930 may be formed of a photo-alignment material such as acrylate-based material or epoxy-based material, but not limited to these materials.

The linear polarization layer 940 may be formed of a mixture of reactive mesogen and dichromatic dye, or may be formed of a mixture of lyotropic liquid crystal and dichromatic dye. The linear polarization layer 940 may have a 90° transmission axis. The linear polarization layer 940 linearly polarizes the incident light at about 90° following the transmission axis.

As described above, the reflection preventing layer 900 according to an embodiment of the present invention may reduce or prevent the external light from being reflected by the use of quarter wave plate 920 and the linear polarization layer 940, which will be described in detail with reference to FIG. 4.

As illustrated in FIG. 4, the quarter wave plate 920 is formed under the substrate 100, and the linear polarization layer 940 is formed under the quarter wave plate 920. As described above, the linear polarization layer 940 linearly polarizes the incident light at about 90°. Also, the quarter wave plate 920 converts a 90° linear polarization into a circular polarization and a circular polarization into a 0° linear polarization.

Accordingly, the external light is linearly polarized at 90° when the external light passes through the linear polarization layer 940, and the linearly polarized light is then circularly polarized when it passes through the quarter wave plate 920. Then, the circularly polarized light is reflected on the plurality of signal lines of the TFT region and the electrodes of the display region after it passes through the substrate 100, and then the reflected light is linearly polarized at 0° while it passes through the quarter wave plate 920. As the 0° linear polarization is substantially orthogonal to the transmission axis of the linear polarization layer 940, it does not pass through the linear polarization layer 940, to thereby reduce or prevent the reflection of the external light.

FIGS. 5A to 5E are views illustrating a manufacturing process for forming a reflection preventing layer according to an embodiment of the present invention, which relates to the manufacturing process of the reflection preventing layer illustrated in FIG. 3.

Figure 5A:
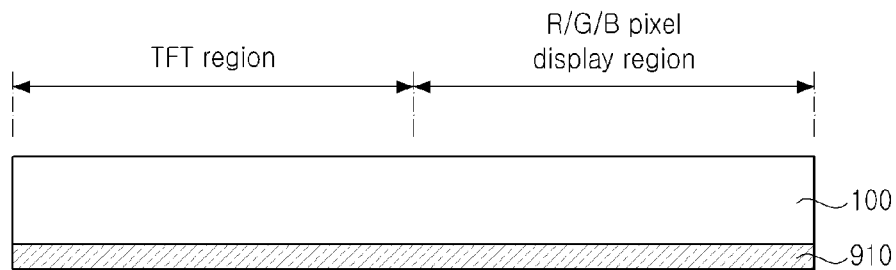
FIGS. 5A to 5E are views illustrating a manufacturing process for forming a reflection preventing layer according to an embodiment of the present invention.

First, as illustrated in FIG. 5A, the first alignment layer 910 is formed on the lower surface of the substrate 100.

The first alignment layer 910 is obtained by forming a photo-alignment material layer through a coating process of a photo-alignment material such as acrylate-based material or epoxy-based material, drying a solvent in a drying oven, curing the photo-alignment material layer, and aligning the photo-alignment material layer in the first direction by a rubbing or polarized UV irradiation.

Figure 5B:
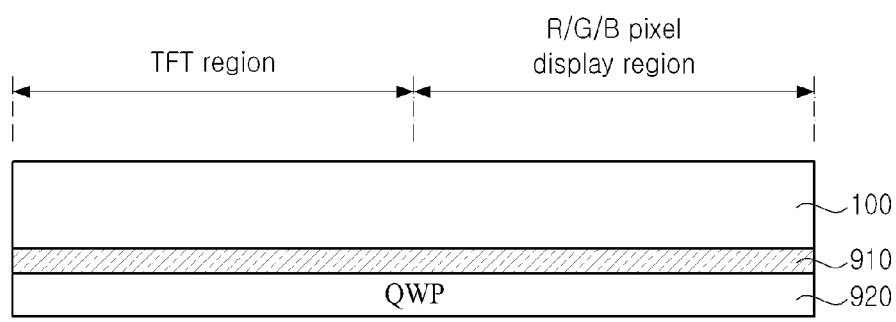

Then, as illustrated in FIG. 5B, the quarter wave plate 920 is formed on the lower surface of the first alignment layer 910.

The quarter wave plate 920 is obtained by coating the lower surface of the first alignment layer 910 with reactive mesogen, drying a solvent in the drying oven, and curing the coated material. This curing process may be performed by a UV irradiation.

The first alignment layer 910 is aligned in the first direction. Thus, the quarter wave plate 920 is aligned by the first alignment layer 910 during the drying process in the drying oven, whereby the quarter wave plate 920 may have a 45° or −45° transmission axis.

Figure 5C:
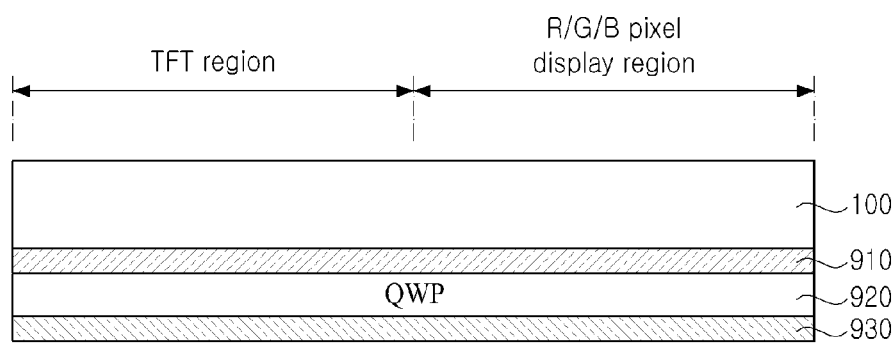

After that, as illustrated in FIG. 5C, the second alignment layer 930 is formed on the lower surface of the quarter wave plate 920.

The second alignment layer 930 is obtained by forming a photo-alignment material layer through a coating process of a photo-alignment material such as acrylate-based material or epoxy-based material, drying a solvent in the drying oven, curing the photo-alignment material layer, and aligning the photo-alignment material layer in the second direction by a rubbing or polarized UV irradiation.

Figure 5D:
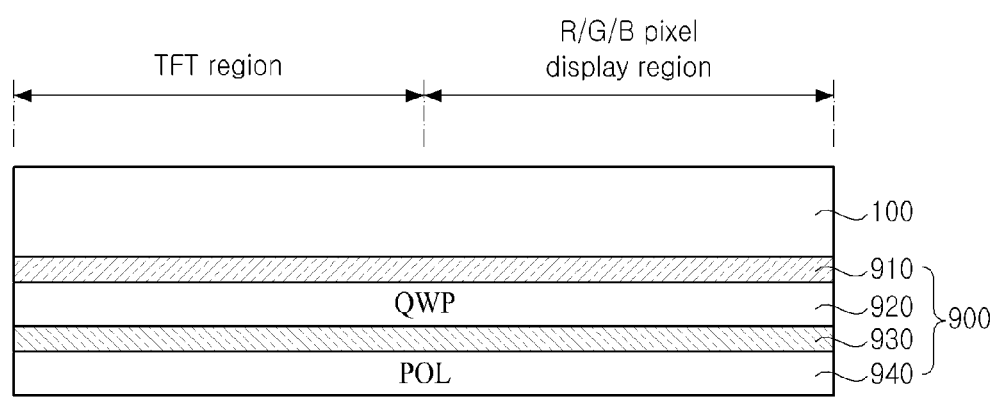

As illustrated in FIG. 5D, the linear polarization layer 940 is formed on the lower surface of the second alignment layer 930.

The linear polarization layer 940 is obtained by coating the mixture of reactive mesogen and dichromatic dye or the mixture of lyotropic liquid crystal and dichromatic dye onto the lower surface of the second alignment layer 930, drying a solvent in the drying oven, and curing the coated material. This curing process may be performed by a UV irradiation.

The second alignment layer 930 is aligned in the second direction. Thus, the linear polarization layer 940 is aligned by the second alignment layer 930 during the drying process in the drying oven, whereby the linear polarization layer 940 may have a 45° or −45° transmission axis.

Figure 5E:
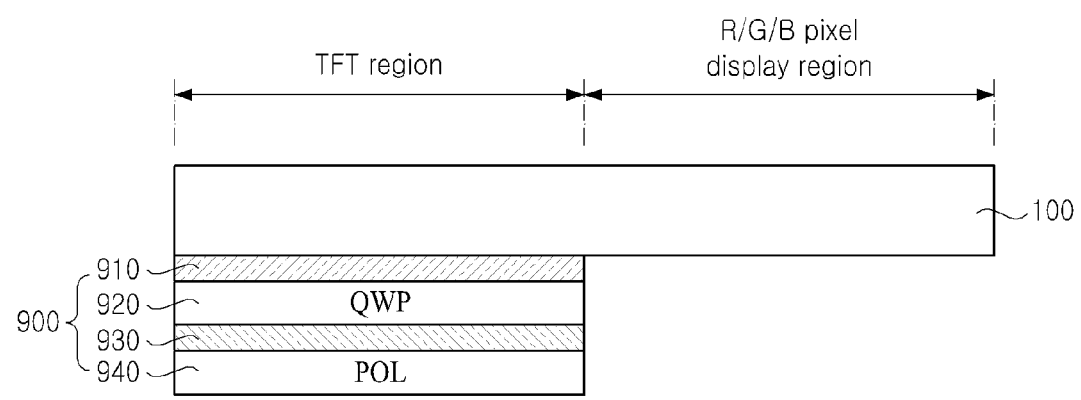

As illustrated in FIG. 5E, the reflection preventing layer 900 is patterned by removing the predetermined portions from the first alignment layer 910, the quarter wave plate 920, the second alignment layer 930 and the linear polarization layer 940.

The process of removing the predetermined portions from the first alignment layer 910, the quarter wave plate 920, the second alignment layer 930 and the linear polarization layer 940 may be performed by a photolithography process of photo resist coating, exposure, development, etching and stripping.

As described above, the predetermined portions of the first alignment layer 910, the quarter wave plate 920, the second alignment layer 930 and the linear polarization layer 940, which are to be removed, correspond to the display regions for the red (R), green (G) and blue (B) pixels.

FIGS. 6A to 6D are views illustrating a manufacturing process for forming the reflection preventing layer according to another embodiment of the present invention, which relates to the manufacturing process of the reflection preventing layer illustrated in FIG. 3.

Figure 6A:
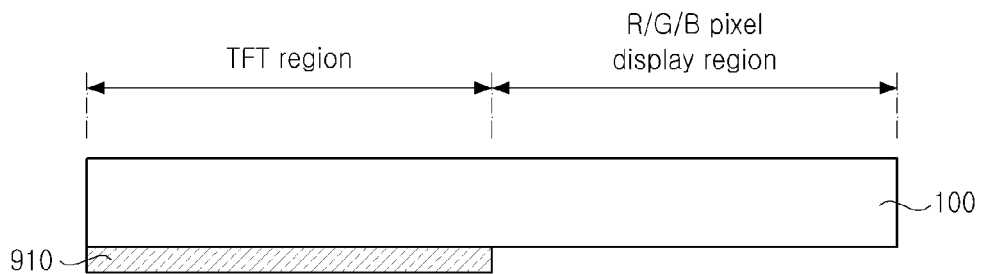
FIGS. 6A to 6D are views illustrating a manufacturing process for forming a reflection preventing layer according to an embodiment of the present invention.

First, as illustrated in FIG. 6A, the first alignment layer 910 is patterned on the lower surface of the substrate 100. The first alignment layer 910 is not formed in the display region for each of the red (R), green (G) and blue (B) pixels, but formed in the TFT region for each pixel and the display region for the white (W) pixel.

The first alignment layer 910 is obtained by forming a photo-alignment material layer through a coating process of a photo-alignment material such as acrylate-based material or epoxy-based material, drying a solvent in the drying oven, curing the photo-alignment material layer, aligning the photo-alignment material layer for the TFT region for each pixel and the display region for the white (W) pixel in the first direction by irradiating a polarized UV light onto the TFT region for each pixel and the display region for the white (W) pixel, and removing the photo-alignment material layer from the display region for each of the red (R), green (G) and blue (B) pixels that is not irradiated with the polarized UV light.

Figure 6B:
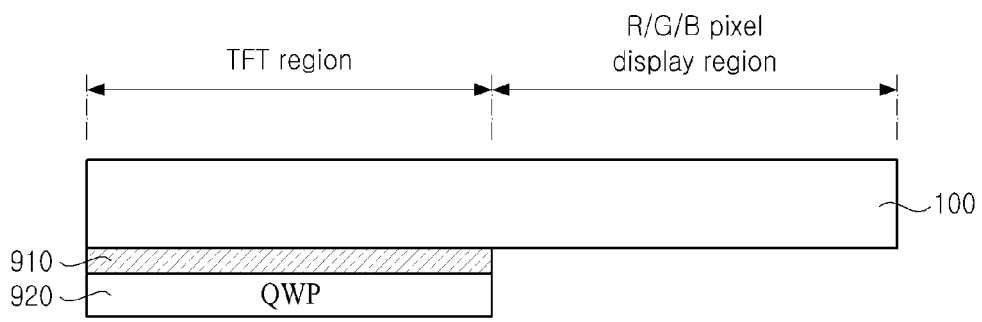

Then, as illustrated in FIG. 6B, the quarter wave plate 920 is formed on the lower surface of the first alignment layer 910. The quarter wave plate 920 is not formed in the display region for each of the red (R), green (G) and blue (B) pixels, but formed in the TFT region for each pixel and the display region for the white (W) pixel.

The quarter wave plate 920 is obtained by coating the lower surface of the first alignment layer 910 with reactive mesogen, curing the reactive mesogen in the TFT region for each pixel and the display region for the white (W) pixel by irradiating a polarized UV light onto the TFT region for each pixel and the display region for the white (W) pixel, and removing the reactive mesogen from the display region for each of the red (R), green (G) and blue (B) pixels that is not irradiated with the polarized UV.

Figure 6C:
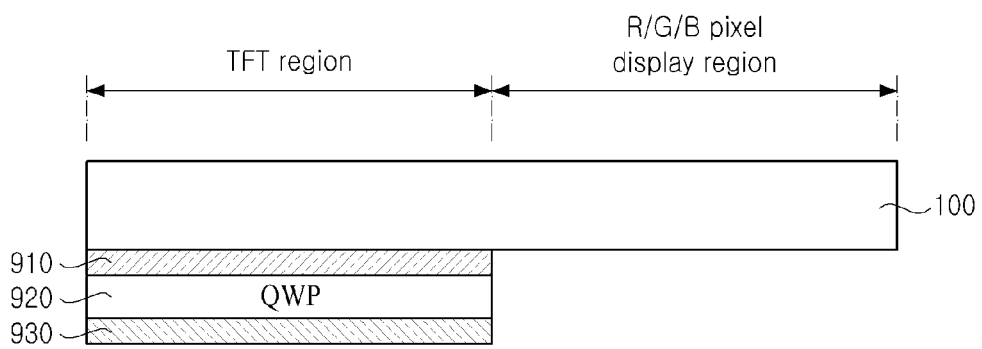

After that, as illustrated in FIG. 6C, the second alignment layer 930 is formed on the lower surface of the quarter wave plate 920. The second alignment layer 930 is not formed in the display region for each of the red (R), green (G) and blue (B) pixels, but formed in the TFT region for each pixel and the display region for the white (W) pixel.

The second alignment layer 930 is obtained by forming a photo-alignment material layer through a coating process of a photo-alignment material such as acrylate-based material or epoxy-based material, drying a solvent in the drying oven, curing the photo-alignment material layer, aligning the photo-alignment material layer for the TFT region for each pixel and the display region for the white (W) pixel in the second direction by irradiating a polarized UV light onto the TFT region for each pixel and the display region for the white (W) pixel, and removing the photo-alignment material layer from the display region for each of the red (R), green (G) and blue (B) pixels that is not irradiated with the polarized UV.

Figure 6D:
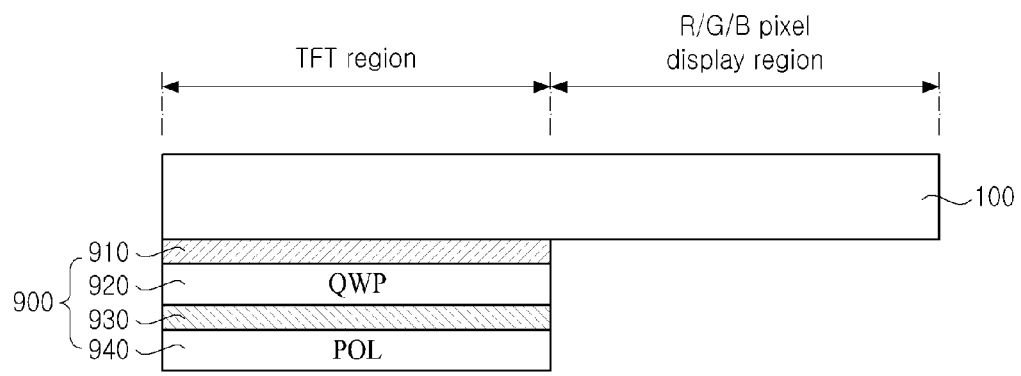

As illustrated in FIG. 6D, the linear polarization layer 940 is formed on the lower surface of the second alignment layer 930, to thereby complete the pattern for the reflection preventing layer 900. The linear polarization layer 940 is not formed in the display region for each of the red (R), green (G) and blue (B) pixels, but formed in the TFT region for each pixel and the display region for the white (W) pixel.

The linear polarization layer 940 is obtained by coating the mixture of reactive mesogen and dichromatic dye or the mixture of lyotropic liquid crystal and dichromatic dye onto the lower surface of the second alignment layer 930, curing the mixture in the TFT region for each pixel and the display region for the white (W) pixel by irradiating a polarized UV light onto the TFT region for each pixel and the display region for the white (W) pixel, and removing the mixture from the display region for each of the red (R), green (G) and blue (B) pixels that is not irradiated with the polarized UV.

Referring back to FIG. 2B, the OLED device according to one embodiment of the present invention may be manufactured by forming the thin film transistor 200 on one surface of the substrate 100, that is, the upper surface of the substrate 100; forming the passivation film 300 on the thin film transistor 200; forming the color filter layer 400 on the passivation film 300; forming the planarization layer 500 on the color filter layer 400; forming the first electrode 600 on the planarization layer 500; forming the light emitting layer 700 on the first electrode 600; forming the second electrode 800 on the light emitting layer 700; and forming the reflection preventing layer 900 on the other surface of the substrate 100, that is, the lower surface of the substrate 100 in accordance with the method illustrated in FIG. 5A to 5E or the method illustrated in FIGS. 6A to 6D. These elements may be formed by various methods generally known to those skilled in the art.

Figure 7:
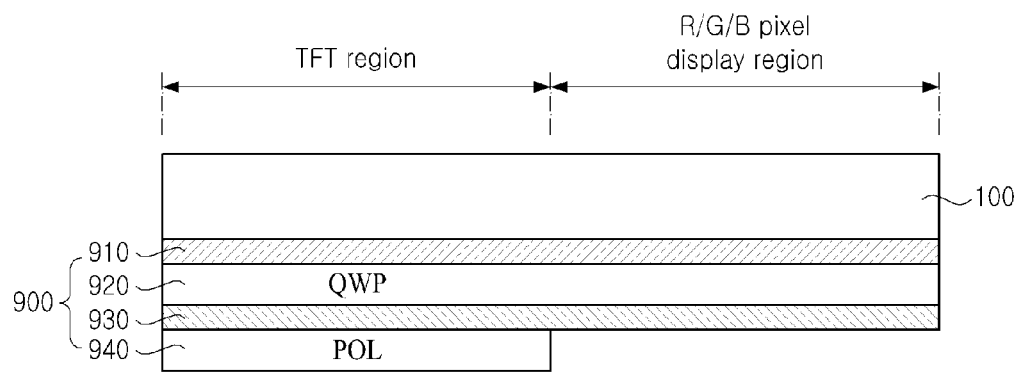
FIG. 7 illustrates an OLED device according to an embodiment of the present invention.

FIG. 7 illustrates an OLED device according to another embodiment of the present invention. The OLED device of FIG. 7 is obtained by additionally forming at least one material layer for the aforementioned reflection preventing layer 900 of FIG. 3 in the display region for each of the red (R), green (G) and blue (B) pixels.

In FIG. 3, the material layer for forming the reflection preventing layer 900 is not formed in the display region for each of the red (R), green (G) and blue (B) pixels. In case of FIG. 7, a first alignment layer 910, a quarter wave plate 920 and a second alignment layer 930 constituting the reflection preventing layer 900, except a linear polarization layer 940, are formed in the display region for each of the red (R), green (G) and blue (B) pixels.

The linear polarization layer 940 transmits only a linearly polarized light having a specific transmission axis among various transmission axes. Thus, if the incident light passes through the linear polarization layer 940, it might cause a considerable loss of the light. Meanwhile, the first alignment layer 910, the quarter wave plate 920 and the second alignment layer 930 correspond to a phase retarder. Thus, even though the light passes through the above first alignment layer 910, the quarter wave plate 920 and the second alignment layer 930, there may be no or small light loss. Accordingly, as illustrated in FIG. 7, even though the first alignment layer 910, the quarter wave plate 920 and the second alignment layer 930 are formed in the display region for each of the red (R), green (G) and blue (B) pixels, there may be no or small light loss.

In FIG. 7, all the first alignment layer 910, the quarter wave plate 920 and the second alignment layer 930 are formed in the display region for each of the red (R), green (G) and blue (B) pixels, but not limited to this structure. That is, at least any one layer of the first alignment layer 910, the quarter wave plate 920 and the second alignment layer 930 may be formed in the display region for each of the red (R), green (G) and blue (B) pixels. For example, only the first alignment layer 910 may be formed in the display region for each of the red (R), green (G) and blue (B) pixels, and alternatively, only the first alignment layer 910 and quarter wave plate 920 may be formed in the display region for each of the red (R), green (G) and blue (B) pixels.

Figure 8:
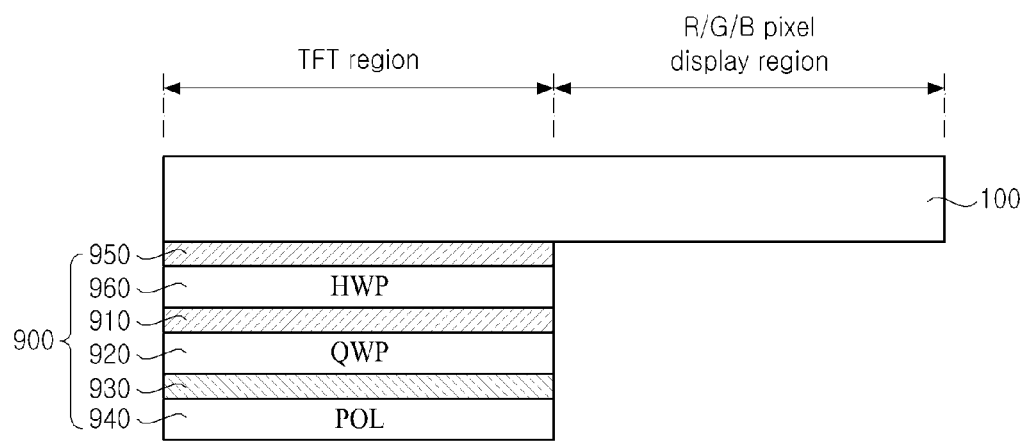
FIG. 8 is a cross-sectional view illustrating a reflection preventing layer according to an embodiment of the present invention.

FIG. 8 is a cross-sectional view illustrating a reflection preventing layer according to another embodiment of the present invention.

As illustrated in FIG. 8, the reflection preventing layer 900 according to another embodiment of the present invention is obtained by additionally forming a third alignment layer 950 and a half wave plate (HWP) 960 between a lower surface of a substrate 100 and a first alignment layer 910.

That is, the reflection preventing layer 900 of FIG. 8 may include the third alignment layer 950, the half wave plate 960, a first alignment layer 910, a quarter wave plate (QWP) 920, a second alignment layer 930 and a linear polarization layer (POL) 940, which are sequentially provided on the lower surface of the substrate 100.

In FIG. 3, the reflection preventing layer 900 uses the quarter wave plate 920 as a phase retarder. Meanwhile, the reflection preventing layer 900 of FIG. 8 uses a combination of the half wave plate 960 and the quarter wave plate 920 as a phase retarder.

The third alignment layer 950 is provided on the lower surface of the substrate 100, and the third alignment layer 950 is aligned in a third direction which may be different from the aforementioned first and second directions. The third alignment layer 950 aligns a material for the half wave plate 960, whereby the half wave plate 960 has a predetermined polarizing function.

The third alignment layer 950 may be formed of a photo-alignment material such as acrylate-based material or epoxy-based material, but not limited to these materials.

The half wave plate 960 may be formed of reactive mesogen, and the half wave plate 960 may have a 15° transmission axis. In this case, the quarter wave plate 920 may have a 75° transmission axis.

A manufacturing process for the third alignment layer 950 and the half wave plate 960 may be similar to the aforementioned manufacturing process for the first alignment layer 910 and the quarter wave plate 920 illustrated in FIGS. 5A to 5C. That is, the third alignment layer 950 may be obtained by forming a photo-alignment material layer through a coating process of a photo-alignment material such as acrylate-based material or epoxy-based material on the lower surface of the substrate 100, drying a solvent in the drying oven, curing the photo-alignment material layer, and aligning the photo-alignment material layer in the third direction by a rubbing or polarized UV irradiation. The half wave plate 960 may be obtained by coating the lower surface of the third alignment layer 950 with reactive mesogen, drying a solvent in the drying oven, and curing the coated material. In this case, since the third alignment layer 950 is aligned in the third direction, the half wave plate 960 is aligned by the third alignment layer 950 during the drying process in the drying oven, whereby the half wave plate 960 may have a 15° transmission axis.

Although not shown in the drawings, it is possible to additionally form at least any one layer of the third alignment layer 950, the half wave plate 960, the first alignment layer 910, the quarter wave plate 920 and the second alignment layer 930 in the display region for each of the red (R), green (G) and blue (B) pixels.

Figure 9:
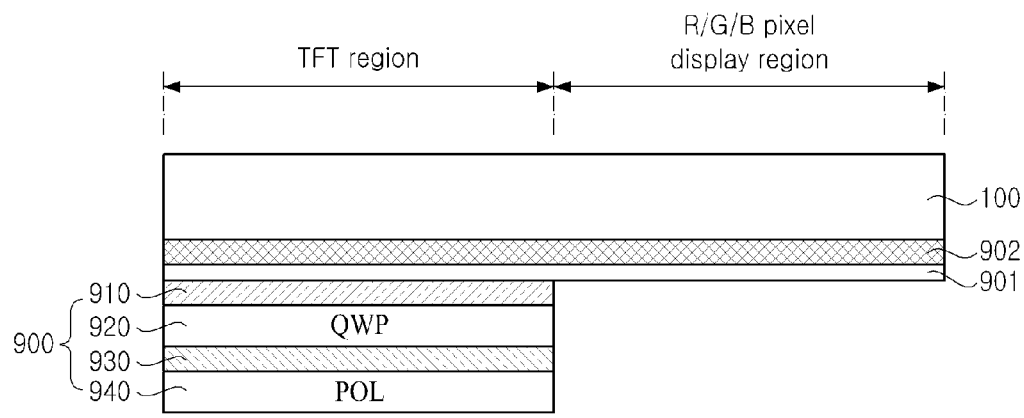
FIG. 9 illustrates an OLED device according to an embodiment of the present invention.

FIG. 9 illustrates an OLED device according to another embodiment of the present invention. In case of FIG. 9, instead of directly forming a reflection preventing layer on a lower surface of a substrate 100, the reflection preventing layer 900 is provided on an additional film 901, and then the film 901 is adhered to the lower surface of the substrate 100 by the use of an adhesive 902.

In the same manner as in FIG. 3, the reflection preventing layer 900 of FIG. 9 may include a first alignment layer 910, a quarter wave plate 920, a second alignment layer 930 and a linear polarization layer 940. However, it is also possible to apply the structure of FIG. 7 or FIG. 8 to the reflection preventing layer 900 of FIG. 9.

The film 901 may be formed of PET-based (polyethylene terephthalate) material, acrylic-based material or TAC-based (Tri-Acetyl Cellulose) material, but not limited to these materials.

The adhesive 902 may be formed of various materials generally known to those skilled in the art, for example, urethane-based material.

Figure 10A:
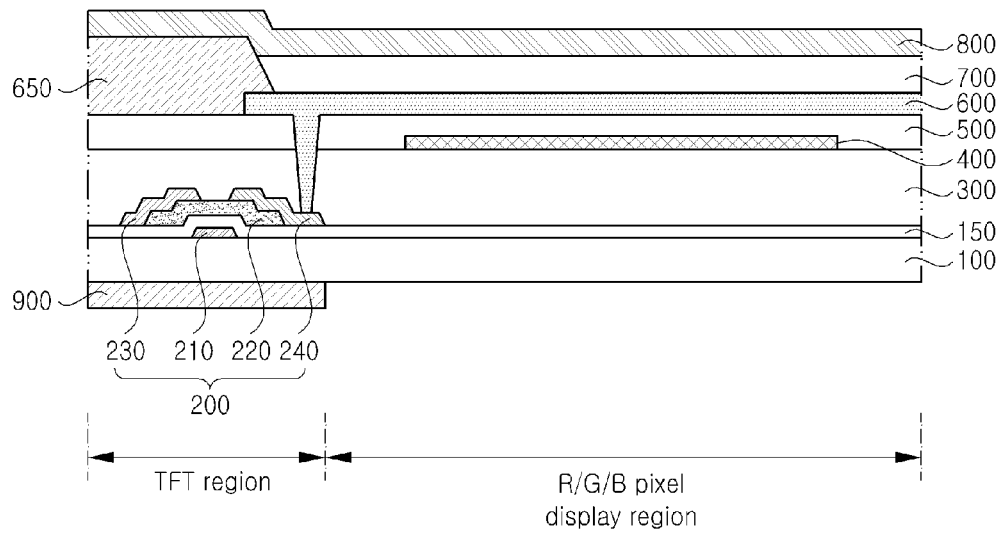
FIGS. 10A and 10B are cross-sectional views illustrating an OLED device according to an embodiment of the present invention.
Figure 10B:
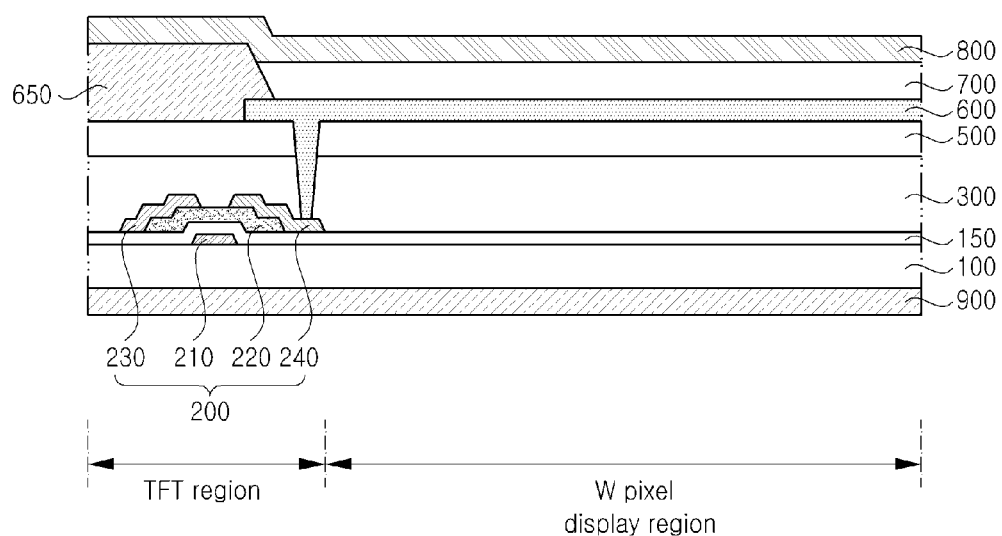

FIGS. 10A and 10B are cross-sectional views illustrating an OLED device according to another embodiment of the present invention, wherein FIG. 10A illustrates red (R), green (G) and blue (B) pixels, and FIG. 10B illustrates a white (W) pixel.

As illustrated in FIG. 10A, the red (R), green (G) or blue (B) pixel is constructed with a substrate 100, a thin film transistor 200, a passivation film 300, a color filter layer 400, a planarization layer 500, a first electrode 600, a bank layer 650, a light emitting layer 700, a second electrode 800 and a reflection preventing layer 900.

The substrate 100 is a base substrate, wherein the substrate 100 may be formed of glass or transparent plastic. If needed, the substrate 100 may be formed of a flexible material.

The thin film transistor 200 is provided on an upper surface of the substrate 100, especially, a TFT region. The thin film transistor 200 may include a gate electrode 210 patterned on the substrate 100, a semiconductor layer 220 insulated from the gate electrode 210 by a gate insulating film 150 interposed therebetween, and source and drain electrodes 230 and 240 provided at a fixed interval from each other and provided on the semiconductor layer 220. As illustrated in the drawings, the thin film transistor 200 is formed in a bottom gate structure in which the gate electrode 210 is positioned below the semiconductor layer 220. The thin film transistor 200 may be formed in a top gate structure in which the gate electrode 210 is positioned above the semiconductor layer 220. The thin film transistor 220 may be formed in various types generally known to those skilled in the art.

The passivation film 300 is provided on the thin film transistor 200, wherein the passivation film 300 is formed in both the TFT region and the display region. The passivation film 300 may be formed of a single-layered insulating film, or may be formed of a dual-layered structure of inorganic insulating layer and organic insulating layer.

The color filter layer 400 is patterned on the passivation film 300, especially, in the display region. The color filter layer 400 may include red (R), green (G) and blue (B) color filters respectively formed for the red (R), green (G) and blue (B) pixels.

The planarization layer 500 is provided on the color filter layer 400. The planarization layer 400 is formed in both the TFT region and the display region, to thereby planarize the surface of substrate 100. A contact hole is formed in a predetermined region of the passivation film 300 and planarization layer 500, whereby a drain electrode 240 of the thin film transistor 200 is exposed via the contact hole.

The first electrode 600 is provided on the planarization layer 500. The first electrode 600 is connected with the drain electrode 240 via the contact hole. The first electrode 600 may function as an anode.

The bank layer 650 is provided on the first electrode 600. The bank layer 650 is provided on the TFT region, to thereby define the display region.

The light emitting layer 700 is provided on the first electrode 600, and is patterned on the display region defined by the bank layer 650. The light emitting layer 700 is formed to emit a white-colored light.

The second electrode 800 is provided on the light emitting layer 700. The second electrode 800 may be formed to serve as a common electrode. Thus, the second electrode 800 may be provided on an entire area of the substrate 100 including the bank layer 650. The second electrode 800 may function as a cathode.

Although not shown in the drawings, an encapsulation layer for preventing a moisture permeation from the external may be provided on the second electrode 800, a sealing layer may be provided on the encapsulation layer, and a protection substrate may be provided on the sealing layer.

The reflection preventing layer 900 is provided on a lower surface of the substrate 100. The reflection preventing layer 900 is not formed in the display region, but formed in the TFT region. A detailed structure of the reflection preventing layer 900 is the same as that of the reflection preventing layer described above, whereby a detailed description for the structure of the reflection preventing layer 900 will be omitted.

As illustrated in FIG. 10B, the white (W) pixel is constructed with the substrate 100, the thin film transistor 200, the passivation film 300, the planarization layer 500, the first electrode 600, the bank layer 650, the light emitting layer 700, the second electrode 800 and the reflection preventing layer 900.

Unlike the aforementioned red (R), green (G) and blue (B) pixels, the white (W) pixel is not provided with the color filter layer 400. Also, since the color filter layer 400 is not formed in the white (W) pixel, the reflection preventing layer 900 is formed not only in the TFT region for the white (W) pixel but also in the display region for the white (W) pixel to reduce or prevent the reflection of an external light in the display region for the white (W) pixel.

Figure 11:
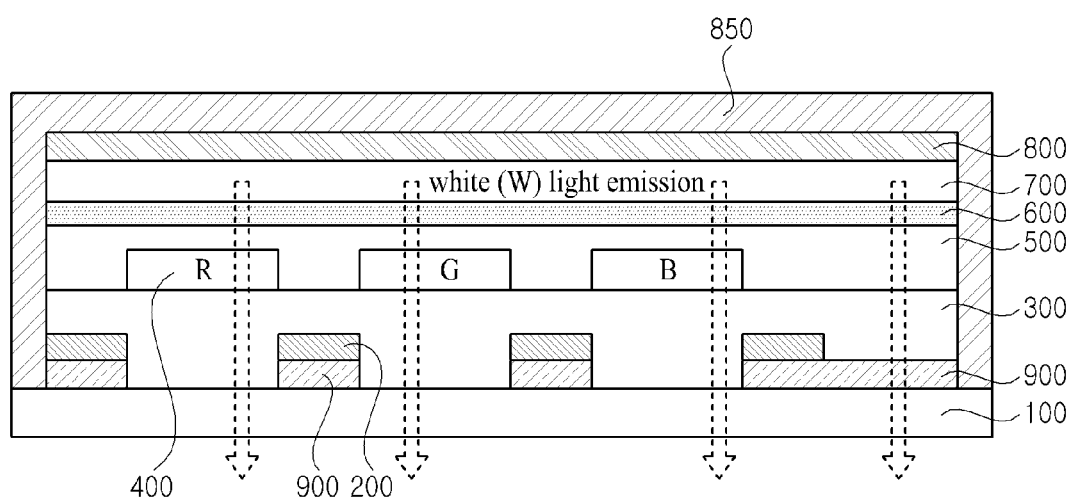
FIG. 11 is a cross-sectional view illustrating an OLED device according to an embodiment of the present invention.

FIG. 11 is a cross-sectional view illustrating an OLED device according to another embodiment of the present invention. As illustrated in FIG. 11, a reflection preventing layer 900 is not provided on a lower surface of a substrate 100, but provided on an upper surface of the substrate 100.

As illustrated in FIG. 11, the OLED may include the substrate 100, the reflection preventing layer 900, a thin film transistor 200, a passivation film 300, a color filter layer 400, a planarization layer 500, a first electrode 600, a light emitting layer 700, a second electrode 800 and a sealing layer 850.

The reflection preventing layer 900 is provided on the upper surface of the substrate 100. In the same manner as those described above, the reflection preventing layer 900 is not formed in the display region for each of the red (R), green (G) and blue (B) pixels, but formed in the TFT region for each pixel and the display region for the white (W) pixel.

The thin film transistor 200 is provided on the reflection preventing layer 900. The passivation film 300, the color filter layer 400, the planarization layer 500, the first electrode 600, the light emitting layer 700 and the second electrode 800 may have a similar or identical structure to those described above, whereby a detailed description will be omitted.

The sealing layer 850 is provided on the second electrode 800, to thereby seal the OLED device. In this case, the sealing layer 850 is provided to seal an entire lateral surface of the reflection preventing layer 900 so as to reduce or prevent the reflection preventing layer 900 from being exposed to the external. If the lateral surface of the reflection preventing layer 900 is exposed to the external, an external moisture might permeate through the exposed lateral surface of the reflection preventing layer 900. For this reason, the entire lateral surface of the reflection preventing layer 900 is sealed by the sealing layer 850, to thereby reduce or prevent permeation of an external moisture. To this end, the reflection preventing layer 900 is not provided on an entire upper surface of the substrate 100. That is, the reflection preventing layer 900 is not formed in an edge of the substrate 100. Accordingly, the sealing layer 850 is formed in the edge of the substrate 100 without the reflection preventing layer 900.

The above description of the OLED device relates to a bottom emission type device in which an image is displayed by the light emitted toward a lower direction of the substrate 100, but not limited to this method. An OLED device according to the present invention may be applied to a top emission type device in which an image is displayed by the light emitted toward an upper direction of the substrate 100.

According to an embodiment of the present invention, the reflection preventing layer 900 is not formed in the display region of the pixels that have the color filter layer, but formed in the display region of the pixel that does not have the color filter layer, whereby it is possible to improve the luminance by reducing or minimizing reflection of an external light and decreasing loss of light.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display (OLED) device comprising:
    first and second pixels on a substrate, each including a TFT region and a display region, the display region of each of the first and second pixels including a first electrode, an emission layer and a second electrode;
    a color filter layer in the display region of the second pixel; and
    a reflection preventing layer in the first and second pixels, substantially excluding the display region of the second pixel,
    wherein the reflection preventing layer in the TFT region of the first pixel has a same thickness as that of the reflection preventing layer in the display region of the first pixel.

2. The OLED device according to claim 1, wherein the first pixel is a white pixel, and the second pixel is any one of red, green and blue pixels.

3. The OLED device according to claim 1, wherein the reflection preventing layer includes a first alignment layer on a first surface of the substrate, a quarter wave plate on the first alignment layer, a second alignment layer on the quarter wave plate, and a linear polarization layer on the second alignment layer.

4. The OLED device according to claim 3, wherein the reflection preventing layer further includes a third alignment layer and a half wave plate between the substrate and the first alignment layer.

5. The OLED device according to claim 1, wherein the display region of the second pixel is provided with at least any one of an alignment layer, a half wave plate, a quarter wave plate.

6. The OLED device according to claim 1, further comprising a film on the substrate with an adhesive therebetween, and wherein the reflection preventing layer is provided on the film.

7. The OLED device according to claim 1, wherein the reflection preventing layer is provided on a surface of the substrate where the first electrode, the emission layer and the second electrode are formed, and a lateral surface of the reflection preventing layer is sealed by a sealing layer.

8. The OLED device according to claim 1, wherein the emission layer emits a white light.

9. The OLED device according to claim 1, wherein the reflection preventing layer includes a phase retarder.

10. A method of manufacturing an organic light emitting display (OLED) device including first and second pixels on a substrate, each including a TFT region and a display region, the display region of each of the first and second pixels including a first electrode, an emission layer and a second electrode, the method comprising:
    forming a color filter layer in the display region of the second pixel; and
    forming a reflection preventing layer in the first and second pixels, substantially excluding the display region of the second pixel,
    wherein the reflection preventing layer in the TFT region of the first pixel has a same thickness as that of the reflection preventing layer in the display region of the first pixel.

11. The method according to claim 10, wherein the process of forming the reflection preventing layer includes:
    forming a first alignment layer on the substrate;
    forming a quarter wave plate on the first alignment layer;
    forming a second alignment layer on the quarter wave plate; and
    forming a linear polarization layer on the second alignment layer.

12. The method according to claim 11, further comprising attaching a film on the substrate before forming the first alignment layer.

13. The method according to claim 12, further comprising:
    forming a third alignment layer on the substrate; and
    forming a half wave plate on the third alignment layer.

14. The method according to claim 11, wherein the reflection preventing layer is formed on the second electrode.

15. The method according to claim 14, further comprising forming a sealing layer on the reflection preventing layer.

16. The method according to claim 15, wherein the part of the reflection preventing layer is at least one of an alignment layer, a half wave plate, a quarter wave plate.

17. The method according to claim 11, wherein the process of forming the linear polarization layer includes coating a mixture of reactive mesogen and dichromatic dye or a mixture of lyotropic liquid crystal and dichromatic dye onto the second alignment layer, curing the mixture for the TFT region for each pixel and the display region for the first pixel by irradiating UV onto the TFT region for each pixel and the display region for the first pixel, and removing the mixture from a display region for the second pixel which is not irradiated with UV.

18. The method according to claim 11, wherein the reflection preventing layer is formed on a surface of the substrate opposite a surface where the first electrode, the emission layer and the second electrode are formed.

19. The method according to claim 10, wherein a part of the reflection preventing layer is formed in the display region of the second pixel.

* * * * *